United States Patent
Park

(10) Patent No.: US 7,606,041 B2
(45) Date of Patent: Oct. 20, 2009

(54) APPARATUS AND METHOD FOR BATTERY PACK CIRCUIT BOARD CRACK PREVENTION

(75) Inventor: Junyoung Park, Yongin-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 202 days.

(21) Appl. No.: 11/638,126

(22) Filed: Dec. 12, 2006

(65) Prior Publication Data

US 2007/0141868 A1 Jun. 21, 2007

(30) Foreign Application Priority Data

Dec. 20, 2005 (KR) .................. 10-2005-0126138

(51) Int. Cl.
*H05K 1/14* (2006.01)
(52) U.S. Cl. .................. 361/749; 361/743; 361/789; 361/784; 174/254; 429/129; 439/493
(58) Field of Classification Search .......... 361/749, 361/743–745, 785, 789, 784; 174/254; 429/127, 429/129; 439/492, 493, 504
See application file for complete search history.

(56) References Cited

U.S. PATENT DOCUMENTS

| | | | | |
|---|---|---|---|---|
| 5,309,316 A | * | 5/1994 | Yagi et al. .................. 361/749 |
| 5,717,556 A | * | 2/1998 | Yanagida .................. 361/803 |
| 5,742,484 A | * | 4/1998 | Gillette et al. .................. 361/789 |
| 5,917,149 A | * | 6/1999 | Barcley et al. .................. 174/378 |
| 5,936,850 A | * | 8/1999 | Takahashi et al. .................. 361/784 |
| 6,040,624 A | * | 3/2000 | Chambers et al. .................. 257/692 |
| 6,172,881 B1 | * | 1/2001 | Hirai .................. 361/816 |
| 6,201,689 B1 | * | 3/2001 | Miyasyo .................. 361/681 |
| 6,448,508 B1 | * | 9/2002 | Lequenne .................. 174/261 |
| 6,531,662 B1 | * | 3/2003 | Nakamura .................. 174/255 |
| 6,594,152 B2 | * | 7/2003 | Dent .................. 361/785 |
| 6,990,355 B2 | * | 1/2006 | Ueyama et al. .................. 455/550.1 |
| 7,012,812 B2 | * | 3/2006 | Haba .................. 361/792 |
| 7,304,373 B2 | * | 12/2007 | Taggart et al. .................. 257/686 |
| 7,388,756 B1 | * | 6/2008 | Worl et al. .................. 361/760 |
| 7,479,345 B2 | * | 1/2009 | Nakamura .................. 429/129 |

* cited by examiner

*Primary Examiner*—Dameon E Levi
(74) *Attorney, Agent, or Firm*—Christie, Parker & Hale, LLP

(57) ABSTRACT

A circuit board apparatus of a battery pack in which tape is attached to low priced flexible printed circuit boards (FPCB) so that it is possible to prevent cracks from being generated in the FPCBs when the FPCBs are bent. The circuit board apparatus includes a first board, a second board, and a bendable third board with one side electrically connected to one side of the first board, and the other side electrically connected to one side of the second board. The first board is oblique to the second board, or the first board is substantially perpendicular to the second board. Protective tape is provided on a first region where the first board and the third board overlap, and in a second region where the second board and the third board overlap.

11 Claims, 2 Drawing Sheets

APPARATUS AND METHOD FOR BATTERY PACK CIRCUIT BOARD CRACK PREVENTION

CROSS-REFERENCE TO RELATED APPLICATION

This application claims priority to and the benefit of Korean Patent Application Ser. No. 10-2005-0126138, filed on Dec. 20, 2005, the entire content of which is incorporated herein by reference.

BACKGROUND OF THE INVENTION

1. Field of the Invention

The invention relates to a battery pack, and more particularly, to a circuit board of a battery pack in which cracks are prevented from being generated in the FPCBs when the FPCBs are bent.

2. Description of the Prior Art

A typical battery pack used in portable electronic apparatuses includes a plurality of bare cells, a protective circuit module (PCM) in which a protective circuit for controlling the charge and discharge of the bare cells is formed, and a terminal line for electrically connecting the bare cells and the protective circuit to each other. The bare cells, the PCM, and the terminal line can be accommodated in a predetermined case.

In the above-described battery pack, the plurality of bare cells are connected to each other in series or in parallel using a tab member to have predetermined voltage and current. The terminal line is connected to the terminal of one cell among the bare cells which are connected to each other in series or in parallel. For example, a conductive tab or wire is connected to the PCM having the protective circuit for controlling the charge, discharge, and the operation of the plurality of bare cells, and the bare cells and the PCM are electrically connected to each other using solder.

The protective circuit connected to the bare cells, and a connector attached to an external electronic apparatus, are electrically connected to each other by electricity that passes through the PCM. Also, protective devices such as thermistors, thermal fuses, and positive temperature coefficient devices can be connected to the PCM.

As described above, a common battery pack includes a plurality of bare cell batteries in a case. A circuit board on which a connector and electronic components are mounted in a circuit pattern, such as a protective circuit, is accommodated into the case. The circuit board is for transmitting and receiving an electrical signal between the bare cell battery and the outside. Accordingly, as electronic products become smaller and more complicated, in order to accommodate the circuit board into the battery pack, whose case is also smaller, it is necessary to effectively use the internal space of the case. One useful method is to use a circuit board with a built in bend.

FIG. 1 is a schematic plan view illustrating the circuit board of a conventional battery pack. As illustrated in FIG. 1, the circuit board 10 of the conventional battery pack includes a first board 11 on which a predetermined circuit pattern is formed, a second board 12 on which a predetermined circuit pattern is formed, and a third board 20 for electrically connecting the first board 11 and the second board 12 to each other.

The first and second boards 11,12 of the circuit board 10 are physically connected to each other with a bending line L interposed. In a state where one side of the first board 11 and one side of the third board 20 are connected to each other, and one side of the second board 12 and the other side of the third board 20 are connected to each other, the first board 11 and the second board 12 are electrically connected to each other. The above-described third board 20 is a flexible printed circuit board (FPCB), which constitutes a circuit pattern and can be bent. Therefore, in order to accommodate the circuit board 10 into the limited space of the case, when the first board 11 and the second board 12 are oriented at a predetermined angle through the bending line L to be physically separated from each other, the third board 20 electrically connects the first board 11 and the second board 12 to each other.

The structure of the circuit board 10 will be described in detail. Predetermined patterns are formed on one surface or both surfaces of each of the first and second boards 11, 12 and electronic components D such as a connector, a semiconductor chip, and a resistor are mounted on the surfaces of the first board 11 and the second board 12. The electronic components D are electrically connected to wiring line patterns 16,17. Terminals 18 connected to the wiring line patterns 16 are formed in the parts where one side of the first board 11 and one side of the third board 20 are to be connected to each other. Terminals 19 connected to the wiring line patterns 17 are formed in the parts where one side of the second board 12 and the other side of the third board 20 are connected to each other. The terminals 18 and 19 are electrically connected, using solder, to the circuit pattern 21 (hereinafter, referred to as a pad) of the third board 20. Reference numeral 22 denotes a soldered connection. The first and second boards 11,12 connected to each other through the pad 21 of the third board 20 are electrically integrated with each other to function as one board. The first board 11 and the second board 12 of the circuit board 10 are bent along the bending line L such that they are separated from each other so that the circuit board 10 may fit in the limited space left with the battery in the case (not shown). Although the first board 11 and the second board 12 are physically separated from each other, they are electrically connected to each other through the third board 20 so that the electrical power and the electrical signal of the battery are exchanged between the battery (not shown) and the external apparatus through the connector and the electronic components of the circuit board 10.

FIG. 2 is a schematic sectional view illustrating that the circuit board of the prior art.

In order to connect one side of the first board 11 and one side of the third board 20 to each other and to connect one side of the second board 12 and the other side of the third board 20 to each other, a conventional hot bar method is used which is well known in the art. In the method, first, solder such as SnPb is printed in the region where one side of the first board 11 and one side of the third board 20 are to be connected to each other and in the region where one side of the second board 12 and the other side of the third board 20 are to be connected to each other. The third board 20 to which the solder is printed is pressed by a hot bar to form the soldered connections. Therefore, one side of the first board 11 and one side of the third board 20 are connected to each other, and one side of the second board 12 and the other side of the third board 20 are connected to each other through the solder 22.

When the circuit board 10 having such a structure is bent along the bending line L of FIG. 1, cracks can be generated in the third board 20 in the solder 22. In the situation where the solder is soldered by the hot bar, and the thickness of the solder 22 is not uniform, an external shock, such as when the board is bent, may adversely affect the solder 22. In particular, the parts that are not uniformly pressed by the hot bar slightly protrude and can be affected by the force generated by the circuit board 10 being bent, and cracks can be generated in the third board 20. The cracks generated in the third board 20 can prevent the first board 11 and the second board 12, that are physically separated from each other by the bending of the circuit board 10, from being electrically connected to each other. Therefore, the cracks may not allow the exchange of the electrical signal between the battery and the external apparatus.

In order to solve the above problem, the circuit board is manufactured in a flame lead method in which a flame leader component is used and built in the case of the battery instead of the low priced FPCBs. Cracks are rarely generated in the circuit board manufactured using the flame lead method. However, since the flame leader component is expensive, and process equipment for the reflow process that is performed in the flame lead method is also expensive, the flame lead method is ineffective in terms of expense. Therefore, it is necessary to use the low priced FPCBs without generating the cracks when the circuit board is bent.

SUMMARY OF THE INVENTION

Accordingly, the invention has been made to reduce or eliminate the problems occurring in the prior art. One embodiment of the invention is to provide a circuit board apparatus for a battery pack in which tape is attached to flexible printed circuit boards (FPCB), which are low priced, so that cracks may be prevented from being generated in the FPCBs when the FPCBs are bent.

One embodiment of the invention provides a circuit board apparatus for a battery pack including a first board having circuits terminating in a first circuit board solder connection region, a second board having circuits terminating in a second circuit board solder connection region, and a bendable third board located between the first and second circuit boards such that a first end of the third circuit board overlaps the first circuit board solder connection region and a second end of the third circuit board overlaps the second circuit board solder connection region, the third circuit board having circuits coupling the circuits terminating in a first circuit board solder connection region to the circuits terminating in a second circuit board solder connection region through solder connections at the respective first circuit board solder connection region and the second circuit board solder connection region. Protective tape is applied on the first circuit board solder connection region and the second circuit board solder connection region.

In an embodiment, the protective tape can be attached surrounding the external surfaces of the first and second regions.

In an embodiment, the protective tape can be composed of a fire retarding material. In another embodiment, the protective tape can be composed of polyester. One embodiment of the invention provides a method for preventing cracks in circuit boards for battery packs, the circuit boards having at least a first circuit board and a second circuit board, the first circuit board having circuits terminating in a first circuit board solder connection region, the second circuit board having circuits terminating in a second circuit board solder connection region. The method includes locating a bendable circuit board between the first circuit board and the second circuit board such that a first end of the bendable circuit board overlaps the first circuit board solder connection region and a second end of the bendable circuit board overlaps the second circuit board solder connection region. The bendable circuit board has circuits coupling the first circuit board to the second circuit board through solder connections at the respective first circuit board solder connection region and the second circuit board solder connection region. Protective tape is overlaid on the first circuit board solder connection region and the second circuit board solder connection region.

BRIEF DESCRIPTION OF THE DRAWINGS

The above and other embodiments of the invention will be more apparent from the following detailed description taken in conjunction with the accompanying drawings, in which.

DETAILED DESCRIPTION OF EXEMPLARY EMBODIMENTS

In a common battery pack, a plurality of bare cell batteries is built in a case. A circuit board in which a connector and electronic components are mounted on a circuit pattern such, as a protective circuit, is accommodated into the case. The circuit board transmits and receives electrical signals between the bare cell batteries and the outside.

Figure 1:
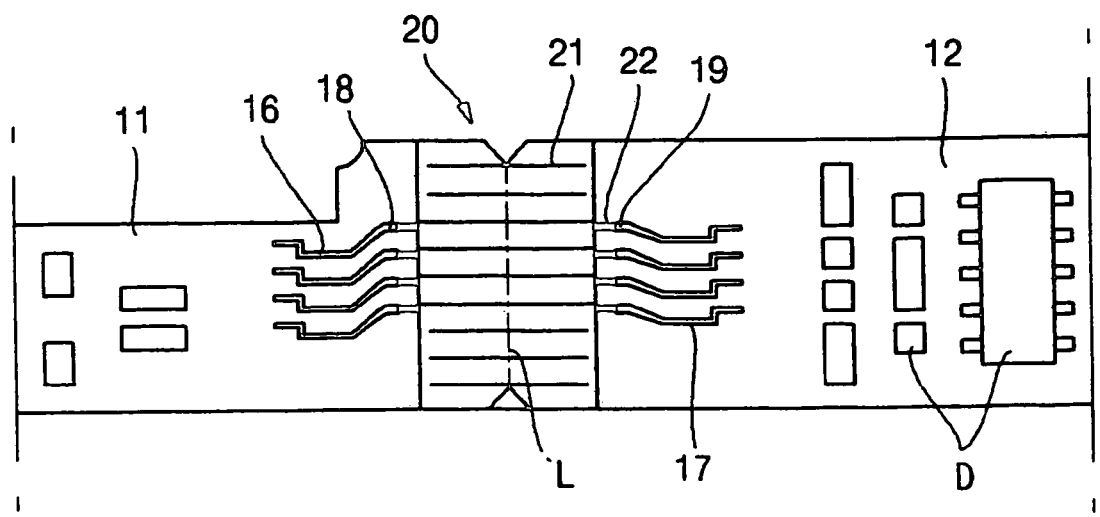
FIG. 1 is a schematic plan view illustrating a circuit board of a conventional battery pack according to the prior art.
Figure 2:
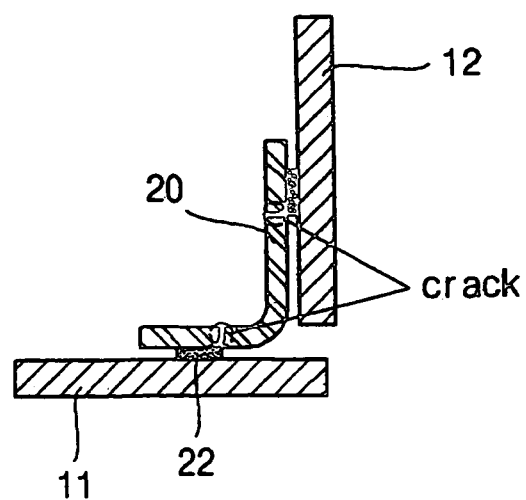
FIG. 2 is a schematic sectional view illustrating that the circuit board according to the prior art.
Figure 3:
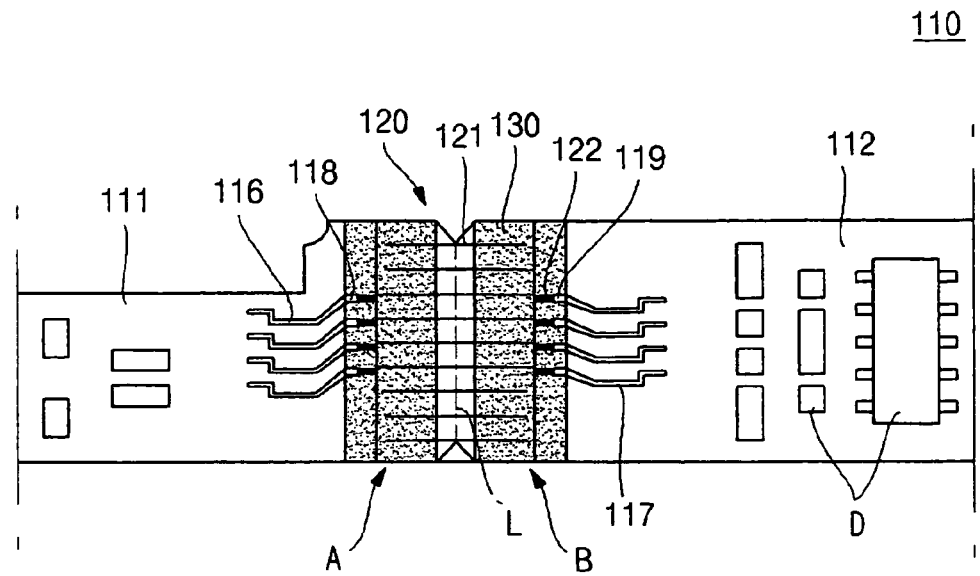
FIG. 3 is a schematic plan view illustrating a circuit board of a battery pack according to an embodiment of the invention.

Referring to FIG. 3, a circuit board 110 of a battery pack according to an embodiment of the invention includes a first board 111 on which a predetermined circuit pattern is formed, a second board 112 on which a predetermined circuit pattern is formed, and a third board 120 for electrically connecting the first board 111 and the second board 112 to each other. In one embodiment, protective tape 130 is attached to the region where the first board 111 and the third board 120 are connected to each other and to the region where the second board 112 and the third board 120 are connected to each other.

The first and second boards 111, 112 of the circuit board 110 are not physically connected to each other, but are oriented with respect to the bending line L interposed therebetween. When one side of the first board 111 and one side of the third board 120 are connected to each other, and one side of the second board 112 and the other side of the third board 120 are connected to each other, the first board 111 and the second board 112 are electrically connected to each other. The above-described third board 120, which is a flexible printed circuit board (FPCB), constitutes the circuit pattern and can be bent. Therefore, in order to accommodate the circuit board 110 into the limited space of the case, the first board 111 and the second board 112 are oriented at a predetermined angle with respect to bending line L such that they are physically separated from each other. The third board 120 electrically connects the first board 111 and the second board 112 to each other. The angle may be oblique, which is an angle neither perpendicular nor parallel to a given line or surface. Thus, in one embodiment the angle may be greater than 0° and less than 90°, or greater than 90° and less than 180°. In another embodiment, the first and second boards 111,112 may be substantially perpendicular to each other.

The structure of one embodiment of the circuit board 110 will now be described in more detail. Predetermined patterns are formed on one surface or both surfaces of each of the first and second boards 111,112 and electronic components D such as a connector, a semiconductor chip, and a resistor are mounted on the surfaces of the first board 111 and the second board 112. The electronic components D are electrically connected to wiring line patterns 116,117. Terminals 118, which are connected to the wiring line patterns 116, are formed in the parts where one side of the first board 111 and one side of the third board 120 are to be connected to each other. Terminals 119, connected to the wiring line patterns 117, are formed in the portions of the board where one side of the second board 112 and the other side of the third board 120 are connected to each other. The terminals 118,119 are electrically connected to the circuit pattern 121 (hereinafter, referred to as a pad) of the third board 120 by soldered connections. Reference numeral 122 denotes a solder connection. The first and second boards 111,112 connected to each other through the pad 121 of the third board 120 are electrically integrated with each other to function as one board. The first board 111 and the second board 112 of the circuit board 110 are oriented such that they are oblique to or parallel to the bending line L, and separated from each other so that the circuit board 110 may be placed in the limited space left after installing the battery in the case (not shown). Although the first board 111 and the second board 112 are physically separated from each other, they are electrically connected to each other through the third board 120 so that the electrical power and the electrical signal of the battery are exchanged between the battery (not shown) and the external apparatus through the connector and the electronic components of the circuit board 110.

In an embodiment, the above first and second boards 111, 112, described as PCBs (printed circuit boards), are obtained by forming a circuit pattern on a planar plate formed of a phenol resin or an epoxy resin.

Figure 4:
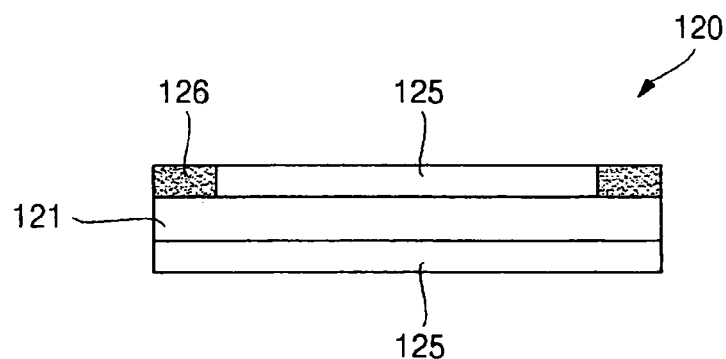
FIG. 4 is a sectional view illustrating the structure of a flexible printed circuit board (FPCB) of an embodiment of the invention.

In one embodiment, the third board 120 that can be bent to electrically connect the first board 111 and the second board 112 to each other and to function as a base film, as illustrated in FIG. 4, is obtained by forming a circuit (hereinafter, referred to as a pad) on a thin insulating film 125 of Cu 121 and by coating the Cu pad 121 with the insulating film 125. At this time, in the third board 120, in order to attach the first board 111 and the second board 112, solder layers 126, composed of materials such as SnPb, are formed in both ends where the first board 111 and the second board 112 are attached.

In an embodiment, in order to connect one side of the first board 111 and one side of the third board 120 to each other and to connect one side of the second board 112 and the other side of the third board 120 to each other, solders such as SnPb are printed to the region in which one side of the first board 111 and one side of the third board 120 are to be connected to each other, and to the region in which one side of the second board 112 and the other side of the third board 120 are to be connected to each other. The third board 120, in the parts where the solder is printed, is soldered by pressing with the hot bar. Therefore, one side of the first board 111 and one side of the third board 120 are connected to each other and one side of the second board 112 and the other side of the third board 120 are connected to each other through the soldered connections 122. Therefore, the first board 111 and the second board 112 are electrically connected to each other through the third board 120.

In one embodiment, the protective tape 130 of the invention is attached to the region A in which the first board 111 and the third board 120 overlap each other and to the region B in which the second board 112 and the third board 120 overlap each other excluding the bending line L. The protective tape 130 is attached to surround the bending line L, to run parallel with the bending line L, and to wrap both surfaces of the regions A and B.

Figure 5:
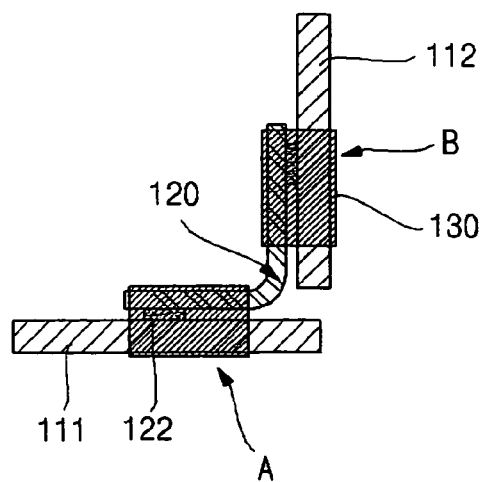
FIG. 5 is a schematic sectional view illustrating that the circuit board according to one embodiment of the invention.

FIG. 5 is a schematic sectional view illustrating that the circuit board according to one embodiment of the invention.

According to an embodiment of the invention, the circuit board 110 on which the protective tape 130 is attached to both surfaces of the region A where the first board 111 and the third board 120 overlap each other, and to the both surfaces of the region B where the second board 112 and the third board 120 overlap each other, is bent in order to effectively use the space in the case.

In one embodiment, one side of the first board 111 and one side of the third board 120 are connected to each other, and one side of the second board 112 and the other side of the third board 120 are connected to each other by the hot bar method. The region A in which the first board 111 and the third board 120 overlap each other, and the region B in which the second board 112 and the third board 120 overlap each other. When the protective tape 130 is attached to the regions A and B, the soldered connections 122 where the first board 111 and the third board 120 are soldered to each other and where the second board 112 and the third board 120 are soldered to each other, are fixed by the protective tape 130 so that the circuit board 110 is less affected by the force generated when the circuit board 110 is bent. Therefore, it is possible to prevent the cracks from being generated in the soldered connections 122 of the circuit board 110. In one embodiment, the protective tape 130 can be formed of a fire retarding material to withstand the heat that can be generated by the circuit board. In an embodiment, the protective tape 130 can be formed of polyester. Each protective tape 130 can be applied to cover from the bending line L of FIG. 3 to the solder connection 122 of each of the first and second boards 111,112.

As described above, the third board 120 is connected to one side of each of the first and second boards 111, 112 so that the protective tape 130 is attached to the portion where the first board 111 and the third board 120 overlap, and to the portion where the second board 112 and the third board 120 overlap. Then, the first board 111 and the second board 112 are pivotally separated from each other. The portion where the first board 111 and the third board 120 overlap each other, and the portion where the second board 112 and the third board 120 overlap each other are fixed, so that they cannot get loose, by protective tape 130. Therefore, the soldered connections 122 formed between one side of the first board 111 and the other side of the third board 120, and between one side of the second board 112 and the other side of the third board 120, are less affected by an external shock such as the force generated when the circuit board 110 is bent. Therefore, in the circuit board including the protective tape according to an embodiment of the invention, it is possible to prevent cracks from being generated in the circuit board by utilizing protective tape according to the embodiments of the invention, unlike in conventional circuit boards which are pivoted without a protective member.

The conventional circuit board which contains no protective member, and the circuit board provided with the protective tapes according to embodiments of the invention are bent by the module of the circuit board to test whether the cracks are generated. TABLE 1 illustrates the results of testing whether cracks are generated in a conventional circuit board which contains no protective members. TABLE 2 illustrates results of testing whether cracks are generated in a circuit board provided with protective tape according to embodiments of the invention.

TABLE 1

| Module Low price FPCB | Angle | \multicolumn{10}{c}{Number of times of test} |
|---|---|---|---|---|---|---|---|---|---|---|---|

| FPCB | Angle | 1 | 2 | 3 | 4 | 5 | 6 | 7 | 8 | 9 | 10 |
|---|---|---|---|---|---|---|---|---|---|---|---|
| 1 | 170' | OK | OK | OK | OK | OK | OK | OK | OK | OK | OK |
| 2 | 170' | OK | OK | OK | OK | OK | OK | OK | OK | OK | OK |
| 3 | 170' | OK | OK | OK | OK | OK | OK | OK | NG | NG | NG |
| 4 | 170' | OK | OK | OK | OK | OK | NG | NG | NG | NG | NG |
| 5 | 170' | OK | OK | NG | NG | NG | NG | NG | NG | NG | NG |
| 6 | 170' | OK | OK | OK | OK | OK | OK | OK | OK | OK | OK |
| 7 | 170' | OK | OK | OK | OK | OK | OK | OK | OK | OK | NG |
| 8 | 170' | OK | OK | OK | OK | OK | OK | OK | OK | OK | OK |
| 9 | 170' | OK | OK | OK | OK | OK | OK | OK | OK | NG | NG |
| 10 | 170' | OK | OK | OK | OK | OK | OK | OK | OK | OK | OK |
| 11 | 170' | OK | OK | OK | OK | OK | OK | OK | OK | OK | OK |
| 12 | 170' | OK | OK | OK | OK | OK | OK | OK | OK | OK | OK |
| 13 | 170' | OK | OK | OK | OK | OK | OK | OK | NG | NG | NG |
| 14 | 170' | OK | OK | OK | OK | OK | OK | OK | OK | OK | OK |
| 15 | 170' | OK | OK | OK | OK | OK | OK | OK | OK | OK | OK |
| 16 | 170' | OK | OK | OK | OK | OK | OK | OK | NG | NG | NG |
| 17 | 170' | OK | OK | OK | OK | OK | NG | NG | NG | NG | NG |
| 18 | 170' | OK | OK | OK | OK | OK | OK | OK | OK | OK | OK |
| 19 | 170' | OK | OK | OK | OK | OK | OK | OK | OK | OK | OK |
| 20 | 170' | OK | OK | OK | NG | NG | NG | NG | NG | NG | NG |
| 21 | 170' | OK | OK | OK | OK | OK | OK | OK | OK | OK | OK |
| 22 | 170' | OK | OK | OK | OK | OK | OK | OK | OK | OK | OK |
| 23 | 170' | OK | OK | OK | OK | OK | OK | OK | OK | OK | OK |

TABLE 2

| FPCB | Angle | 1 | 2 | 3 | 4 | 5 | 6 | 7 | 8 | 9 | 10 |
|---|---|---|---|---|---|---|---|---|---|---|---|
| 1 | 170' | OK | OK | OK | OK | OK | OK | OK | OK | OK | OK |
| 2 | 170' | OK | OK | OK | OK | OK | OK | OK | OK | OK | OK |
| 3 | 170' | OK | OK | OK | OK | OK | OK | OK | OK | OK | OK |
| 4 | 170' | OK | OK | OK | OK | OK | OK | OK | OK | OK | OK |
| 5 | 170' | OK | OK | OK | OK | OK | OK | OK | OK | OK | OK |
| 6 | 170' | OK | OK | OK | OK | OK | OK | OK | OK | OK | OK |
| 7 | 170' | OK | OK | OK | OK | OK | OK | OK | OK | OK | OK |
| 8 | 170' | OK | OK | OK | OK | OK | OK | OK | OK | OK | OK |
| 9 | 170' | OK | OK | OK | OK | OK | OK | OK | OK | OK | OK |
| 10 | 170' | OK | OK | OK | OK | OK | OK | OK | OK | OK | OK |
| 11 | 170' | OK | OK | OK | OK | OK | OK | OK | OK | OK | OK |
| 12 | 170' | OK | OK | OK | OK | OK | OK | OK | OK | OK | OK |
| 13 | 170' | OK | OK | OK | OK | OK | OK | OK | OK | OK | OK |
| 14 | 170' | OK | OK | OK | OK | OK | OK | OK | OK | OK | OK |
| 15 | 170' | OK | OK | OK | OK | OK | OK | OK | OK | OK | OK |
| 16 | 170' | OK | OK | OK | OK | OK | OK | OK | OK | OK | OK |
| 17 | 170' | OK | OK | OK | OK | OK | OK | OK | OK | OK | OK |
| 18 | 170' | OK | OK | OK | OK | OK | OK | OK | OK | OK | OK |
| 19 | 170' | OK | OK | OK | OK | OK | OK | OK | OK | OK | OK |
| 20 | 170' | OK | OK | OK | OK | OK | OK | OK | OK | OK | OK |
| 21 | 170' | OK | OK | OK | OK | OK | OK | OK | OK | OK | OK |
| 22 | 170' | OK | OK | OK | OK | OK | OK | OK | OK | OK | OK |
| 23 | 170' | OK | OK | OK | OK | OK | OK | OK | OK | OK | OK |

In Tables 1 and 2, 'OK' means that the cracks are not generated and 'NG' means that the cracks are generated. Referring to the test results of TABLE 1, when the circuit boards containing no protective members are bent, cracks are generated. However, referring to the results of TABLE 2, cracks are not generated in all of the circuit boards provided with protective tape. Therefore, It is noted from the above test results that it is possible to prevent cracks from being generated in circuit boards when protective tape is attached to the circuit boards.

As described above, in a circuit board of the battery pack according to one embodiment of the invention, protective tape is attached to the both surfaces of the regions where the FPCBs and the PCBs overlap each other to fix the regions so that the FPCBs in the parts where the soldered connections are formed are protected against external shock, such as the force generated when the circuit board 110 is bent, and that it is possible to prevent cracks from being generated in the FPCBs. Therefore, it is possible to prevent the electrical connection between the battery and the external apparatus from being severed, and to exchange electrical signals between the battery and the external apparatus.

Also, the circuit board of the battery pack according to an embodiment of the invention is formed using the hot bar method on low price FPCBs so that it is possible to significantly reduce the expenses compared with circuit boards formed by the flame lead method using the high price flame leader components, and to increase manufacturing yield.

Although exemplary embodiments of the invention have been described for illustrative purposes, those skilled in the art will appreciate that various modifications, additions and substitutions are possible, without departing from the scope and spirit of the invention as disclosed in the accompanying claims.

What is claimed is:

1. A circuit board apparatus of a battery pack comprising:
    a first board having circuits terminating in a first board solder connection region;
    a second board having circuits terminating in a second board solder connection region;
    a bendable third board located between the first board and the second board such that a first end of the third board overlaps the first board solder connection region and a second end of the third board overlaps the second board solder connection region, the third board having circuits electrically connecting the circuits terminating in the first board solder connection region to the circuits terminating in the second board solder connection region;
    a first solder connection coupling the third board and the first board at the first board solder connection region;
    a second solder connection coupling the third board and the second board at the second board solder connection region;
    a first protective tape on the first board solder connection region and the first solder connection; and
    a second protective tape on the second board solder connection region and the second solder connection.

2. The circuit board apparatus in claim 1, wherein the first board is oblique to the second board.

3. The circuit board apparatus in claim 1, wherein the first board is substantially perpendicular to the second board.

4. The circuit board apparatus in claim 1, wherein the first protective tape surrounds external surfaces of the first board at the first board solder connection region, and the second protective tape surrounds external surfaces of the second board at the second board solder connection region.

5. The circuit board apparatus in claim 1, wherein the first protective tape and the second protective tape are made of a fire retarding material.

6. The circuit board apparatus in claim 1, wherein the first protective tape and the second protective tape are made of polyester.

7. A method of preventing cracks in circuit boards for battery packs, the circuit boards comprising at least a first circuit board and a second circuit board, the first circuit board having circuits terminating in a first circuit board solder connection region, the second circuit board having circuits terminating in a second circuit board solder connection region, the method comprising:
    arranging a bendable circuit board between the first circuit board and the second circuit board such that a first end of the bendable circuit board overlaps the first circuit board solder connection region and a second end of the bendable circuit board overlaps the second circuit board solder connection region, the bendable circuit board having circuits electrically connecting the first circuit board to the second circuit board;
    coupling the bendable circuit board and the first circuit board at the first circuit board solder connection region via a first solder connection;
    coupling the bendable circuit board and the second circuit board at the second circuit board solder connection region via a second solder connection;
    overlaying the first circuit board solder connection region and the first solder connection with a first protective tape; and
    overlaying the second circuit board solder connection region and the second solder connection with a second protective tape.

8. The method of claim 7, wherein the first protective tape and the second protective tape are made of a fire retarding material.

9. The method of claim 7, wherein the first protective tape and the second protective tape are made of polyester.

10. The circuit board apparatus in claim 1, wherein the first protective tape wraps around the third board and the first board at a region where the third board overlaps the first board solder connection region, and the second protective tape wraps around the third board and the second board at a region where the third board overlaps the second board solder connection region.

11. The method of claim 7, wherein the overlaying the first circuit board solder connection region and the first solder connection with the first protective tape comprises wrapping the first protective tape around the bendable circuit board and the first circuit board at a region where the bendable circuit board overlaps the first circuit board solder connection region, and wherein the overlaying the second circuit board solder connection region and the second solder connection with the second protective tape comprises wrapping the second protective tape around the bendable circuit board and the second circuit board at a region where the bendable circuit board overlaps the second circuit board solder connection region.

* * * * *